United States Patent
Qiu et al.

(10) Patent No.: US 9,635,764 B2
(45) Date of Patent: Apr. 25, 2017

(54) INTEGRATED CIRCUIT AND METHOD THAT UTILIZE A SHAPE MEMORY MATERIAL

(71) Applicant: Intel Corporation, Santa Clara, CA (US)

(72) Inventors: Shipeng Qiu, Chandler, AZ (US); Shawna Liff, Gilbert, AZ (US); Kayleen L Helms, Chandler, AZ (US); Joshua D Heppner, Chandler, AZ (US); Adel Elsherbini, Chandler, AZ (US); Johanna Swan, Scottsdale, AZ (US); Gary M. Barnes, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/866,648

(22) Filed: Sep. 25, 2015

(65) Prior Publication Data

US 2017/0094799 A1    Mar. 30, 2017

(51) Int. Cl.
*H05K 1/02* (2006.01)
*H05K 1/18* (2006.01)
(Continued)

(52) U.S. Cl.
CPC ............ *H05K 1/189* (2013.01); *H05K 1/028* (2013.01); *H05K 1/144* (2013.01); *H05K 3/0014* (2013.01);
(Continued)

(58) Field of Classification Search
CPC ......... H05K 1/028; H05K 1/189; H05K 3/326
See application file for complete search history.

(56) References Cited

U.S. PATENT DOCUMENTS 7,443,003 B2 * 10/2008 Yang ................. H01L 35/00
257/415
8,198,349 B2 * 6/2012 Xiao .................. C08G 59/226
523/468
(Continued)

FOREIGN PATENT DOCUMENTS

JP    2015038868 A    2/2015

OTHER PUBLICATIONS

Partial Translation, Du et al., CN102332436, Jan. 26, 2012, Two Pages.*

(Continued)

*Primary Examiner* — Evan Pert
(74) *Attorney, Agent, or Firm* — Schwegman Lundberg & Woessner, P.A.

(57) ABSTRACT

An integrated circuit that includes a substrate having a shape memory material (SMM), the SMM is in a first deformed state and has a first crystallography structure and a first configuration, the SMM is able to be deformed from a first configuration to a second configuration, the SMM changes to a second crystallography structure and deforms back to the first configuration upon receiving energy, the SMM returns to the first crystallography structure upon receiving a different amount of energy; and an electronic component attached to substrate. In other forms, the SMM is in a first deformed state and has a first polymeric conformation and a first configuration, the SMM changes from a first polymeric conformation to a second polymeric conformation and be deformed from a first configuration to a second configuration, the SMM changes returns to the first polymeric conformation and deforms back to the first configuration upon receiving energy.

19 Claims, 11 Drawing Sheets

(51) Int. Cl.
- *H05K 3/32* (2006.01)
- *H05K 1/14* (2006.01)
- *H05K 3/36* (2006.01)
- *H05K 3/22* (2006.01)
- *H05K 3/30* (2006.01)
- *H05K 3/00* (2006.01)

(52) U.S. Cl.
CPC ............. *H05K 3/22* (2013.01); *H05K 3/303* (2013.01); *H05K 3/326* (2013.01); *H05K 3/361* (2013.01); H05K 2201/0133 (2013.01); H05K 2201/041 (2013.01); H05K 2201/057 (2013.01); H05K 2201/10007 (2013.01); H05K 2201/10128 (2013.01); H05K 2203/10 (2013.01); H05K 2203/104 (2013.01); H05K 2203/105 (2013.01); H05K 2203/1105 (2013.01)

(56) References Cited

U.S. PATENT DOCUMENTS

| | | | | |
|---|---|---|---|---|
| 8,608,999 | B2* | 12/2013 | Xie | B29C 61/06 264/237 |
| 8,685,528 | B2* | 4/2014 | Xie | C09J 7/0203 156/711 |
| 9,054,224 | B2* | 6/2015 | Braun | H01L 24/05 |
| 9,314,885 | B2* | 4/2016 | Chen | B23P 11/00 |
| 9,331,126 | B2* | 5/2016 | Lee | H01L 27/3244 |
| 2002/0046856 | A1* | 4/2002 | Alcoe | H05K 3/3436 174/534 |
| 2004/0048497 | A1* | 3/2004 | Hougham | H05K 7/1061 439/65 |
| 2009/0085228 | A1* | 4/2009 | Sun | H01L 23/3157 257/783 |
| 2009/0280330 | A1 | 11/2009 | Xie et al. | |
| 2010/0265239 | A1 | 10/2010 | Amundson et al. | |
| 2011/0144751 | A1* | 6/2011 | Brown | A61L 31/04 623/16.11 |
| 2012/0183819 | A1* | 7/2012 | Yamamoto | H01M 2/026 429/61 |
| 2012/0280422 | A1* | 11/2012 | Xie | B29C 61/06 264/237 |
| 2013/0127690 | A1* | 5/2013 | Tsai | G09F 9/301 345/55 |
| 2013/0242150 | A1* | 9/2013 | Wittenberg | G03B 9/08 348/294 |
| 2013/0298548 | A1* | 11/2013 | Chen | B23P 11/00 60/527 |
| 2014/0009035 | A1* | 1/2014 | Toyoda | H01G 5/16 310/330 |
| 2015/0093559 | A1* | 4/2015 | Baer | B32B 27/08 428/216 |
| 2015/0185764 | A1 | 7/2015 | Magi | |
| 2015/0282304 | A1* | 10/2015 | Ely | H05K 1/0281 361/750 |
| 2016/0017870 | A1* | 1/2016 | Mather | F03G 7/065 60/527 |
| 2016/0040657 | A1* | 2/2016 | Felton | F03G 7/065 60/527 |
| 2016/0118361 | A1* | 4/2016 | Karpati | H01L 24/72 257/689 |
| 2016/0202476 | A1* | 7/2016 | Chong | G02B 27/0068 359/743 |
| 2016/0209877 | A1* | 7/2016 | Chong | G06F 1/1652 |

OTHER PUBLICATIONS

"International Application Serial No. PCT/US2016/048466, International Search Report mailed Nov. 30, 2016", 3 pgs.
"International Application Serial No. PCT/US2016/048466, Written Opinion mailed Nov. 30, 2016", 8 pgs.

* cited by examiner

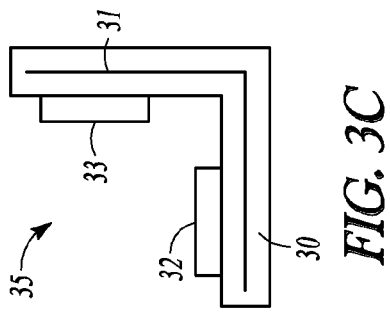
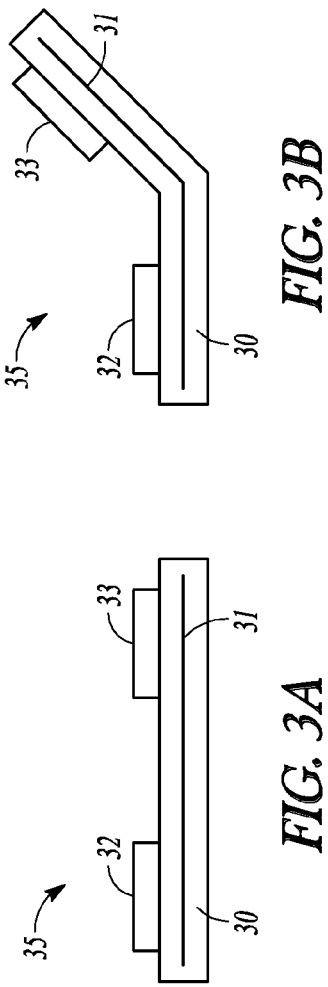
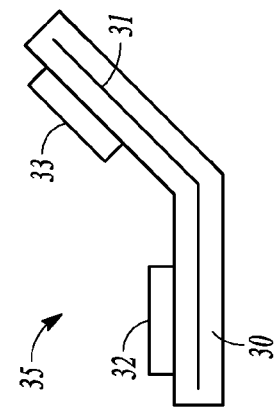
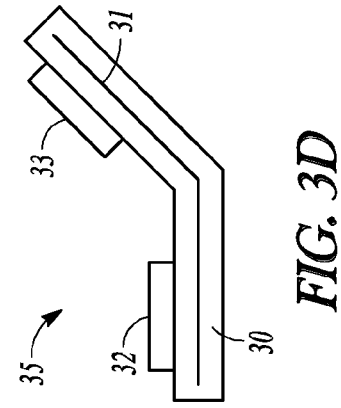
FIG. 3A  FIG. 3B  FIG. 3C  FIG. 3D  FIG. 3E

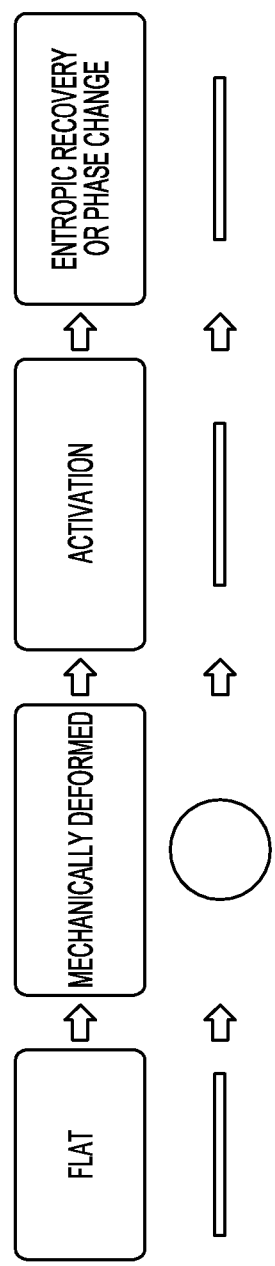

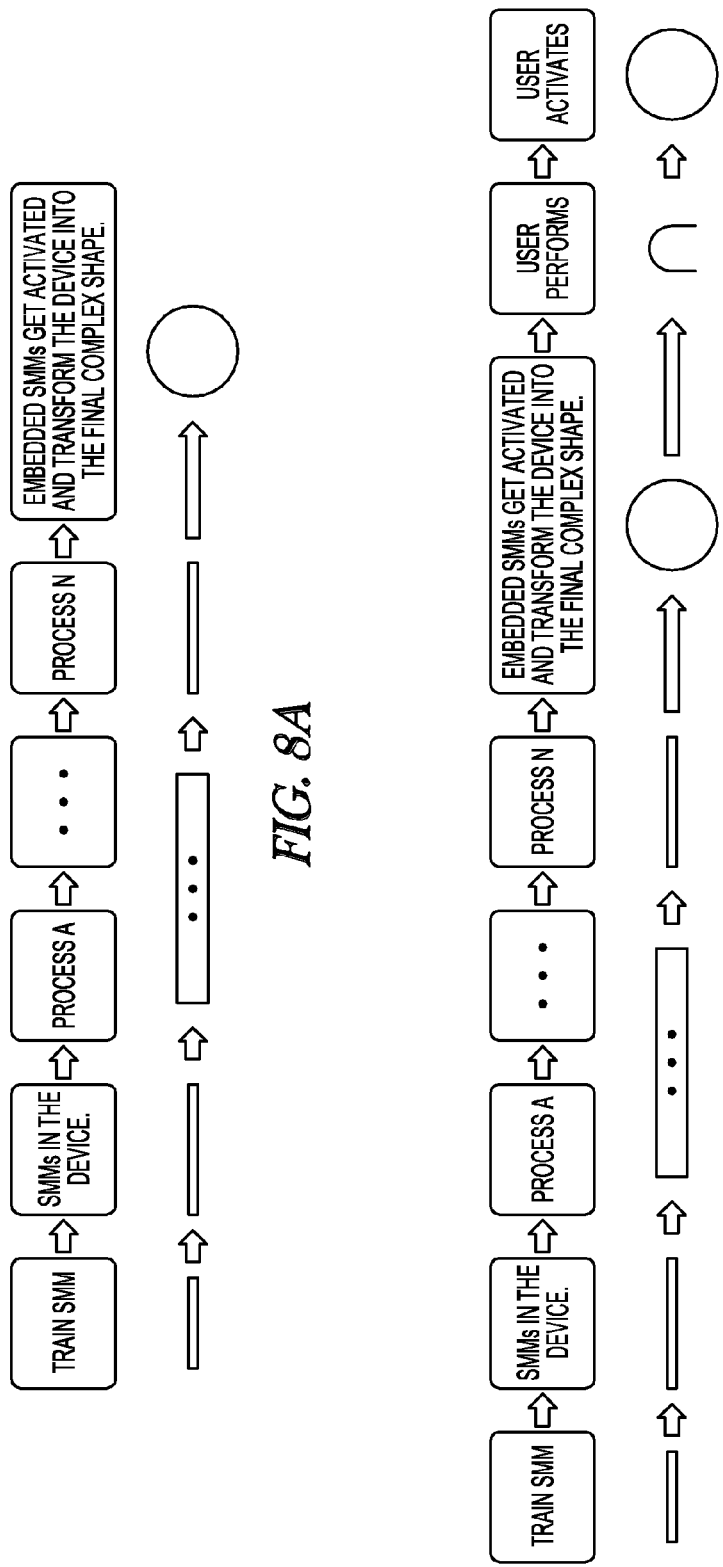

INTEGRATED CIRCUIT AND METHOD THAT UTILIZE A SHAPE MEMORY MATERIAL

TECHNICAL FIELD

Embodiments described herein generally relate to an integrated circuit and method, and more particularly to an integrated circuit and method that utilize a shape memory material.

BACKGROUND

Conventional integrated circuits and methods typically include rigid flex packages that are manually folded into their final and unchangeable state. In addition, conventional integrated circuits and methods sometimes utilize flexible hinges, joints and cabling to connect rigid sub-assemblies.

The types of known integrated circuits and methods are usually limited in package design, and have problematic issues with balancing stress and deformation response for different applications. In addition, conventional integrated circuits and methods are typically unable to provide flexibility in packaging and applications that require changing physical configurations.

The development of cloud computing, smart sensors, flexible electronics and all other supporting technologies should lead to an expansion in the number of computing applications across different market segments in the future. However, as the devices become thinner, lighter and smaller, innovative design and manufacturing processes may be required in order to meet the various complex exterior shapes/contours that will be needed for final electronic products. The need for flexibility in the shape of electronic systems is ever increasing such that there is a need for devices that may take more than shape (e.g., during operation of the electronic system or for packaging of the electronic systems—among many other potential applications).

BRIEF DESCRIPTION OF THE DRAWINGS

FIGS. 3A-3E show an example integrated circuit that includes a shape memory material.

FIG. 7 shows an example process flow for using a substrate that includes a shape memory material.

FIGS. 8A and 8B show additional and more detailed example process flows for using a substrate that includes a shape memory material.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The integrated circuits and methods described herein utilize shape memory materials, which include, but are not limited to, shape memory alloys and shape memory polymers. Shape memory materials have unique properties that permit it to change shape upon activation by a particular type of energy. By using shape memory materials that may be simply activated and physically deformed, the shape memory materials may be incorporated into substrates for use in a variety of electronic devices.

The integrated circuits and methods described herein may reduce the need for rigid flex packages that are manually folded into their final and unchangeable state. In addition, the integrated circuits and methods described herein may not require the use of flexible hinges, joints and cabling that is typically used to connect rigid sub-assemblies. The integrated circuits and methods may also provide more freedom in package design, balancing stress and deformation response for a variety of different applications.

The shape memory materials may provide flexibility in packaging and applications that require changing physical configurations. The shape memory materials may allow the integrated circuits that include such shape memory materials to have more than one physical configuration. The shape memory materials may undergo a shape change one time, or multiple times through repeated deformation and activation by a particular type of energy.

Figure 1:
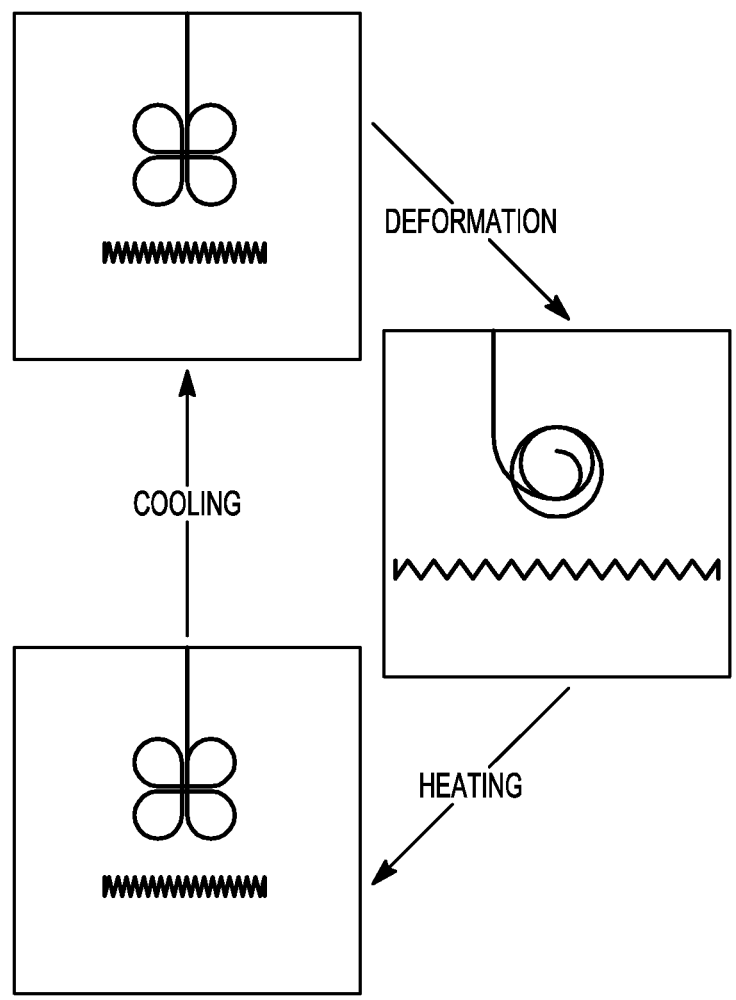
FIG. 1 is a schematic view illustrating an example activation and physical shape change sequence for a shape memory material.
Figure 2:
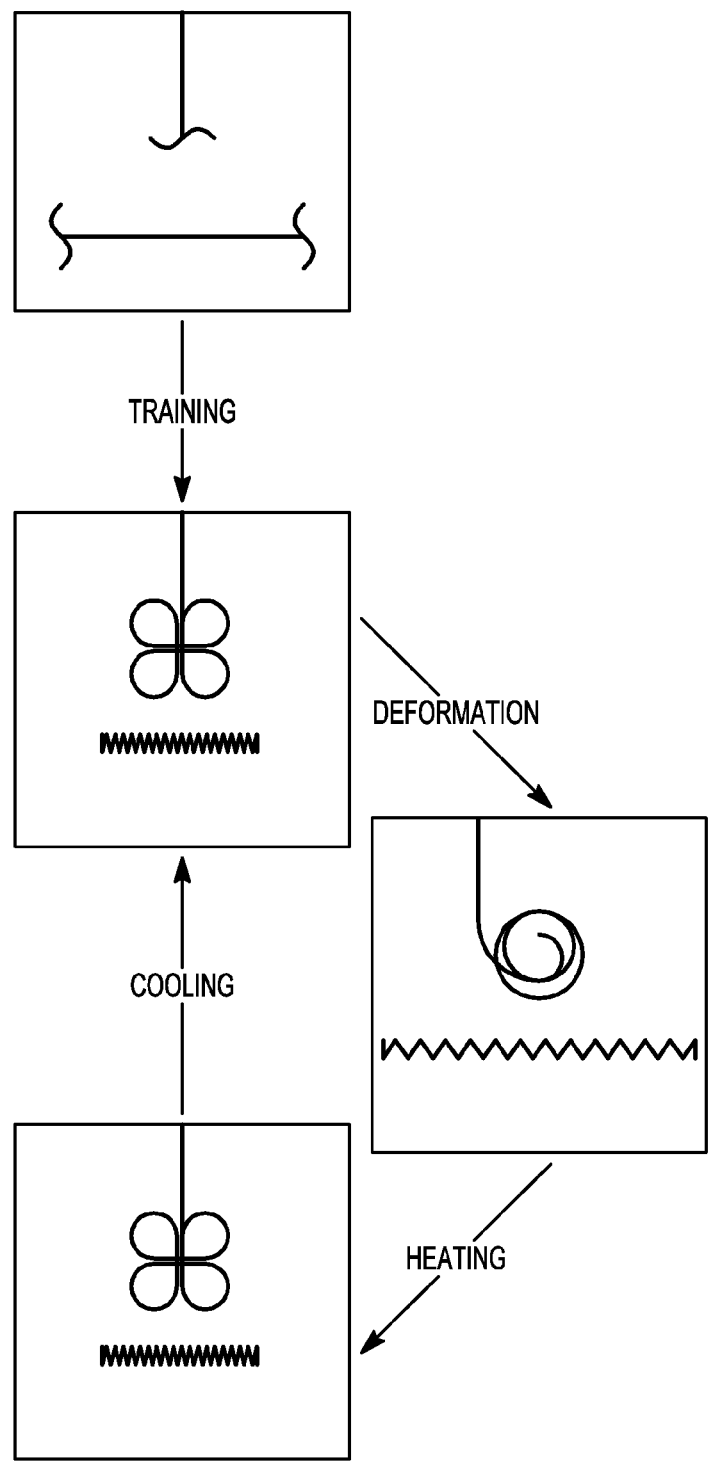
FIG. 2 is a schematic view similar to FIG. 1 where the shape memory material is physically deformed before the illustrated example activation and physical shape change sequence.

FIG. 1 is a schematic view illustrating an example activation and physical deformation sequence for a shape memory material. FIG. 2 is a schematic view similar to FIG. 1 where the shape memory material is physically deformed before the illustrated example activation and physical deformation sequence.

FIGS. 3A-3E show an integrated circuit 35. The integrated circuit 35 includes a substrate 30 having a shape memory material 31 (see FIG. 3A). The shape memory material 31 is then placed in a first physically deformed state and has a first crystallography structure and a first configuration (see FIG. 3B). As an example, the shape memory material 31 may be a shape memory alloy (among other types of materials).

The shape memory material 31 is able to be physically deformed from a first configuration to a second configuration (see FIG. 3C). The shape memory material 31 changes to a second crystallography structure and physically deforms back to the first configuration upon being supplied with energy (see FIG. 3D). The shape memory material 31 returns to the first crystallography structure upon application of a different amount of energy (see FIG. 3E) (e.g., removing the energy entirely). As an example, the shape memory material 31 may cool down and assume a lower temperature stable phase when the energy is no longer supplied to the shape memory material 31.

In some forms, one or more electronic components 32, 33 may be attached to the substrate 30. The type of electronic components that are included in the integrated circuit 35 will depend in part on the application where the integrated circuit 35 is to be used (among other factors).

As examples, the shape memory material 31 may change to a second crystallography structure and physically deform back to the first configuration upon being supplied with at least one of electrical, thermal, mechanical or ultra-violet energy (among other types of energy). The type of energy that is used will depend in part on the manufacturing processes and types of materials that are included in the integrated circuit 35.

In the example form that is illustrated in FIGS. 3A-3E, the shape memory material 31 is embedded in the substrate 30. It should be noted that other forms are contemplated where the shape memory material 31 is partially embedded in the substrate 30, or merely attached to the substrate 30 using any process that is known now, or discovered in the future.

Figure 4:
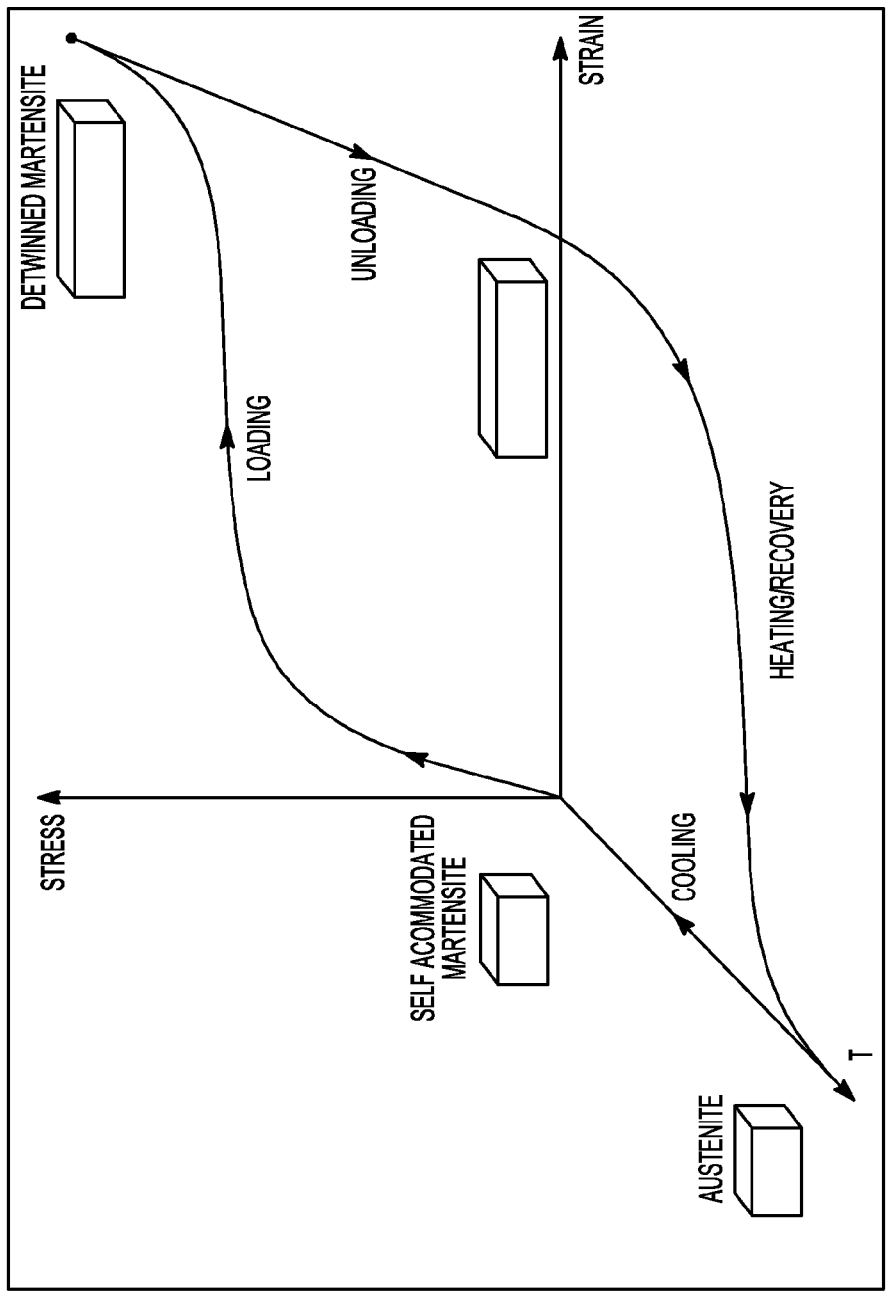
FIG. 4 shows stress-strain-temperature relationships and the associated phase transformations for an example metallic shape memory material.

FIG. 4 shows stress-strain-temperature relationships and the associated phase transformations for an example metallic shape memory material (e.g., NITINOL). It should be noted that a variety of shape memory materials are contemplated for inclusion into the integrated circuit 35 and the corresponding stress-strain-temperature relationships for those materials may be different than the stress-strain-temperature relationships shown in FIG. 4.

In some forms, the integrated circuit 35 includes a plurality of electronic components 32, 33 that are attached to the substrate 30. In some forms, at least two of the plurality electronic components 32, 33 are electrically connected when the substrate 30 is in at least one of the first configuration or the second configuration. In other forms, the electronic components 32, 33 are electrically connected when the substrate 30 is in both the first configuration and the second configuration. In still other forms, the electronic components 32, 33 are not electrically connected when the substrate 30 is in both the first configuration and the second configuration.

A variety of electronic components may be used in the integrated circuit 35. As examples, the electronic components may include at least one of an electronic package, a display, an antenna, a power source, or display (among various other types of electronic components).

The integrated circuit 35 may further include at least one of a textile, a chassis, and/or a printed circuit board (none are shown) that is attached to the substrate 30. It should be noted that a variety of items are contemplated for attachment to the substrate 30. The item (or items) that are attached to the substrate 30 will depend in part on the application for the integrated circuit 35 (among other factors). Any item that is attached to the substrate 30 may (or may not) include a shape memory material, or be readily deformable in order to move with the substrate 30 as the substrate 30 is activated and deactivated. In addition, forms of the integrated circuit 35 are contemplated where the item that is attached to the substrate 30 is rigid and only the substrate 30 deforms upon activation.

FIGS. 5A-5E are schematic views of an example integrated circuit 50. Integrated circuit 55 includes a substrate 50 that includes a shape memory material 51 (see FIG. 5A). The shape memory material 51 is in a first physically deformed state and has a first polymeric conformation and a first configuration (see FIG. 5B).

Figure 5C:
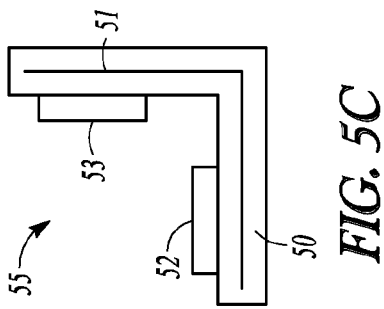
FIGS. 5A-5D show another example integrated circuit that includes a shape memory material.
Figure 5B:
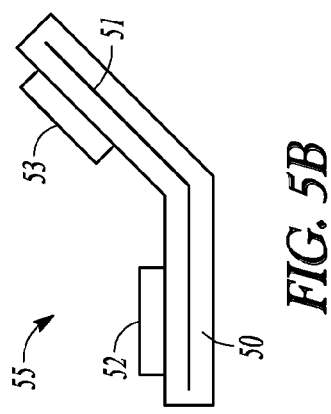
Figure 5D:
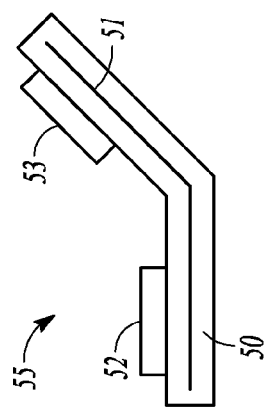
Figure 5A:
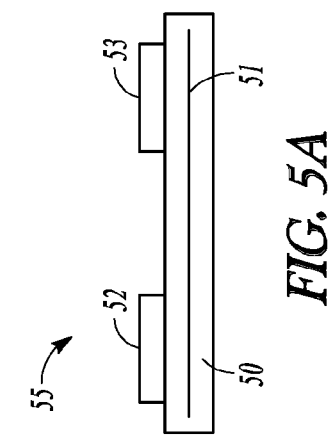

The shape memory material 51 is able to change from a first polymeric conformation to a second polymeric conformation and be physically deformed from a first configuration to a second configuration (see FIG. 5C). The shape memory material 51 returns to the first polymeric conformation and physically deforms back to the first configuration upon being supplied with energy (see FIG. 5D). As an example, the shape memory material 31 may be a shape memory polymer or polymer composite (among other types of materials).

Similar to integrated circuit 35 described above, the integrated circuit 55 may include a variety of electronic components 52, 53 that are attached to the substrate 50. The number and type of electronic components that are attached to the substrate 50 will depend in part on the application where the integrated circuit 55 is to be used.

In some forms, the shape memory material 51 changes to the first polymeric conformation and physically deforms back to the first configuration upon being supplied at least one of electrical, thermal, magnetic or ultra-violet energy (among other types of energy). In some forms, the shape memory material 51 maintains the first polymeric confirmation upon removal of the energy. The types of energy that are supplied to the shape memory material 51 will depend in part on the manufacturing processes and materials that are used in the integrated circuit 55.

In the example form that is illustrated in FIGS. 5A-5D, the shape memory material 51 is embedded in the substrate 50. It should be noted that other forms are contemplated where the shape memory material 51 is partially embedded in the substrate 50, or merely attached to the substrate 50 using any process that is known now, or discovered in the future.

In some forms, the integrated circuit 55 includes a plurality of electronic components 52, 53 that are attached to the substrate 50. In some forms, at least two of the plurality electronic components 52, 53 are electrically connected when the substrate 50 is in at least one of the first configuration or the second configuration. In other forms, the electronic components 52, 53 are electrically connected when the substrate 50 is in both the first configuration and the second configuration. In still other forms, the electronic components 52, 53 are not electrically connected when the substrate 50 is in both the first configuration and the second configuration.

The integrated circuit 55 may further include at least one of a textile, a chassis, and/or a printed circuit board (none are shown) that is attached to the substrate 50. It should be noted that a variety of items are contemplated for attachment to the substrate 50. The item (or items) that are attached to the substrate 50 will depend in part on the application for the integrated circuit 55 (among other factors). Any item that is attached to the substrate 50 may (or may not) include a shape memory material, or be readily deformable in order to move with the substrate 50 as the substrate 50 is activated and deactivated. In addition, forms of the integrated circuit 55 are contemplated where the item that is attached to the substrate 50 is rigid and only the substrate 50 deforms upon activation.

Figure 6:
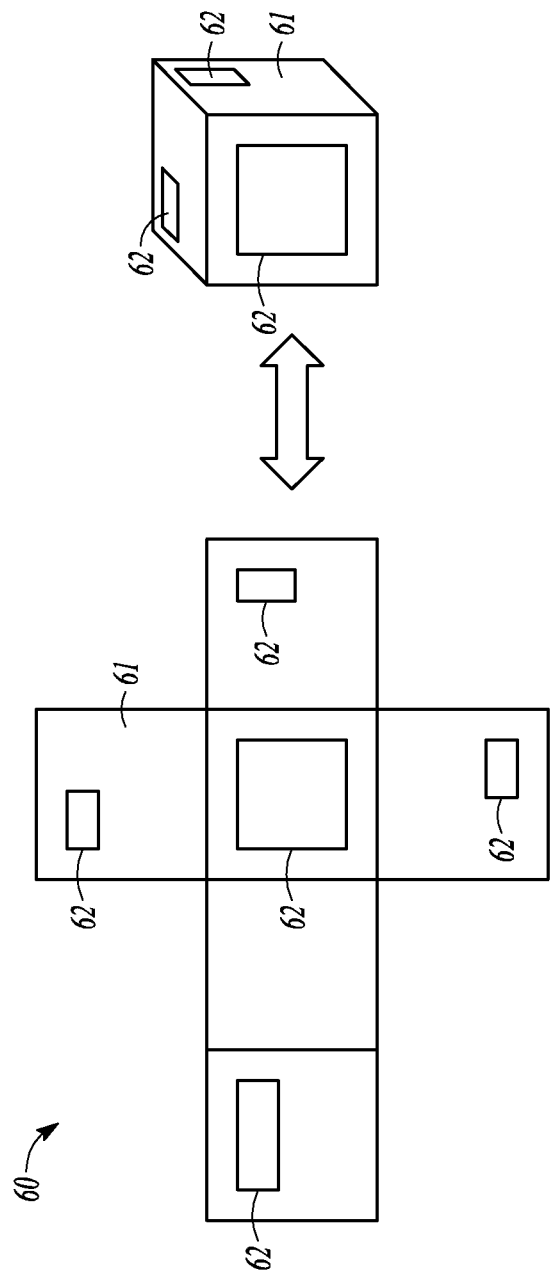
FIG. 6 illustrates a simplified schematic side view of an activation and physical deformation sequence for an example substrate that includes electronic components and a shape memory material.

FIG. 6 illustrates a simplified schematic view of an activation and physical deformation sequence for an example substrate 61 that includes electronic components 62 and a shape memory material (not visible in FIG. 6). It should be noted that the substrate 61 may move back and forth in either direction for the substrate 61 shown in FIG. 6 depending on the configuration of initial trained state for the substrate 61. In addition, it should be noted that the substrate 61 may have numerous other configurations, and be transformed into numerous different types of shapes. It should be noted that the configurations for the activated and deactivated states of the shape memory material will depend on the application where the integrated circuit is to be used.

FIG. 7 shows an example process flow for using a substrate that includes a shape memory material. FIGS. 8A-8B show additional and more detailed example process flows for using a substrate that includes a shape memory material.

Figure 9A:
FIGS. 9A and 9B show another example process flow for embedding an SMM into a substrate and transforming the shape memory material into a different configuration.
Figure 9B:

FIGS. 9A and 9B show example process flows for embedding a shape memory material into a substrate and transforming the shape memory material into a different configuration.

Figure 10:
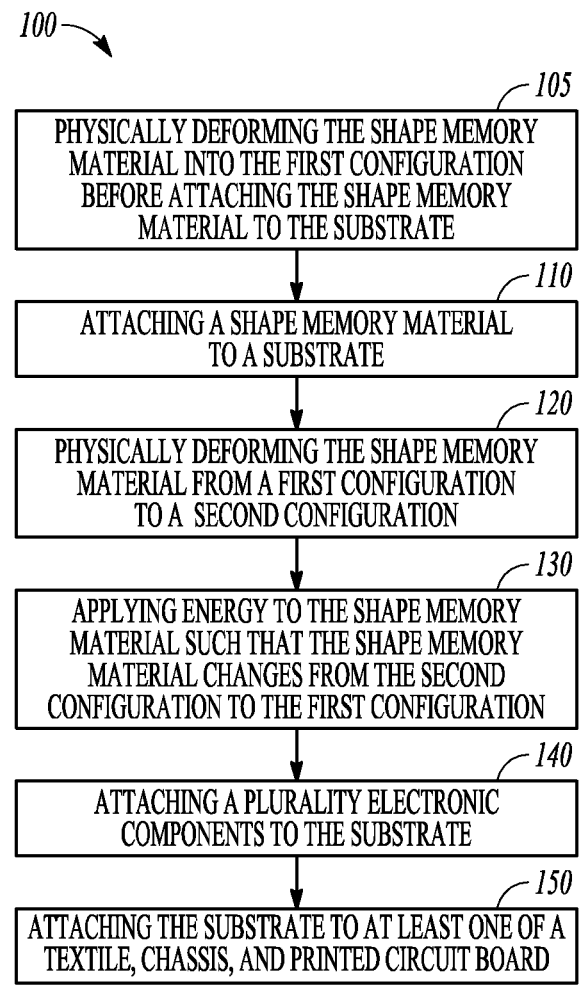
FIG. 10 is a flow diagram illustrating an example method of using an integrated circuit.

FIG. 10 is flow diagram illustrating an example method 100 of using an integrated circuit. The method [100] includes [110] attaching a shape memory material to a substrate and [120] physically deforming the shape memory material from a first configuration to a second configuration.

The method [100] further includes [130] applying energy to the shape memory material. Applying energy to the shape memory material changes the shape memory material from the second configuration to the first configuration.

In some forms, applying energy to the shape memory material includes applying at least one of electrical, thermal, magnetic or ultra-violet energy to the shape memory material. The type of energy that is applied to the shape memory material will depend in part on the manufacturing processes and materials that are used to fabricate the integrated circuit (among other factors).

In some forms, the method further includes [105] physically deforming the shape memory material into the first configuration before (or after) attaching the shape memory material to the substrate. This initial physical deformation may be referred to as training the shape memory material to be in the first configuration.

The method may further include [140] attaching a plurality of electronic components to the substrate. In some forms, physically deforming the shape memory material from the first configuration to the second configuration includes electrically connecting one electronic component to another electronic component. In other forms, the electronic components are never electrically connected no matter whether the shape memory material is in the first configuration or the second configuration. In still other forms of the method [100], the electronic components are electrically connected when the shape memory material is in both the first configuration and the second configuration.

In some forms, the method may further include [150] attaching the substrate to at least one of a textile, a chassis and/or a printed circuit board. As discussed above relative to integrated circuits 35, 55, the type of item that it is attached to the substrate will depend in part on the application where the integrated circuit is to be used (among other factors).

It should be noted that the order of the operations described herein relative to the method [100] may be performed in any order besides the order that is shown specifically in FIG. 10. The order in which the operations are performed will depend in part on the types of materials that are used in the method [100] as well as the desired application for the integrated circuits that are fabricated using the method [100]. It should be noted that activation to the final configuration may happen after a system-level test, or at various times during the manufacturing processes.

The order of operations for the method [100] will also depend in part on whether the shape memory material is metallic or a polymer (i.e., compare FIGS. 3A-3E with FIGS. 5A-5D). In addition, the shape memory material may or may not be trained depending on where and when the various operations of the method [100] take place.

In some forms, no activation of the shape memory material takes place during assembly to another device in order to simplify the assembly process. The shape memory material may be prevented from activation either by attaching the shape memory material near the end of the assembly process or selecting a shape memory material with a high activation temperature that is not reached during the assembly process. It should be noted that forms of the method are contemplated where the shape memory material gets activated and physically deforms to a final shape after a system level test or during end consumer use (among other applications).

Figure 11:
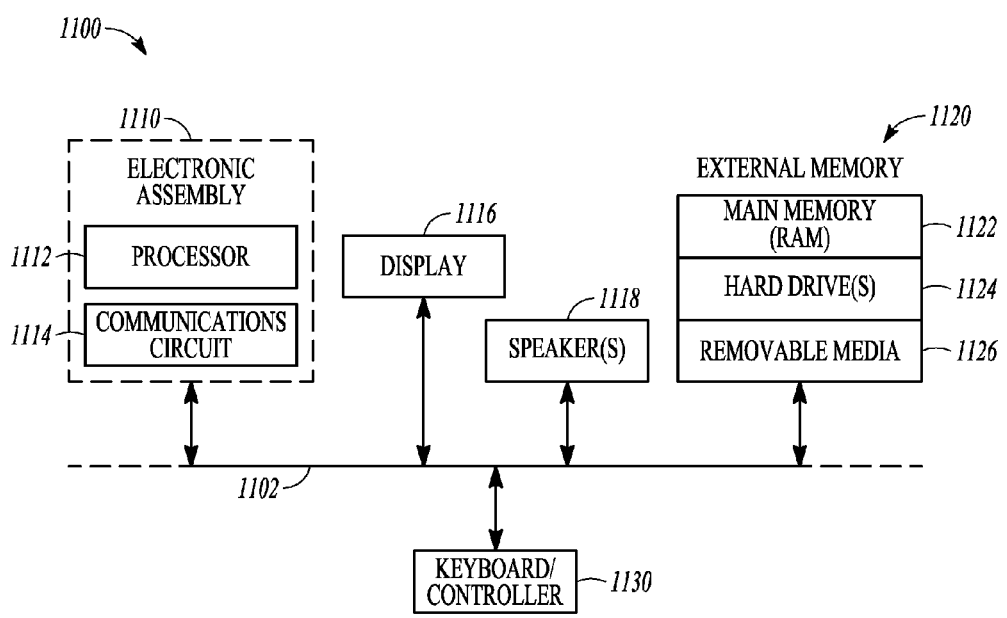
FIG. 11 is a block diagram of an electronic apparatus that includes the electronic assemblies and/or the electronic packages described herein.

FIG. 11 is a block diagram of an electronic apparatus 1100 incorporating at least one integrated circuit and/or method described herein. Electronic apparatus 1100 is merely one example of an electronic apparatus in which forms of the integrated circuits and/or methods described herein may be used. Examples of an electronic apparatus 1100 include, but are not limited to, personal computers, tablet computers, mobile telephones, game devices, MP3 or other digital media players, etc. In this example, electronic apparatus 1100 comprises a data processing system that includes a system bus 1102 to couple the various components of the electronic apparatus 1100. System bus 1102 provides communications links among the various components of the electronic apparatus 1100 and may be implemented as a single bus, as a combination of busses, or in any other suitable manner.

An electronic apparatus 1100 as describe herein may be coupled to system bus 1102. The electronic apparatus 1100 may include any circuit or combination of circuits. In one embodiment, the electronic apparatus 1100 includes a processor 1112 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1100 are a custom circuit, an application-specific integrated circuit (ASIC), or the like, such as, for example, one or more circuits (such as a communications circuit 1114) for use in wireless devices like mobile telephones, tablet computers, laptop computers, two-way radios, and similar electronic systems. The IC can perform any other type of function.

The electronic apparatus 1100 may also include an external memory 1120, which in turn may include one or more memory elements suitable to the particular application, such as a main memory 1122 in the form of random access memory (RAM), one or more hard drives 1124, and/or one or more drives that handle removable media 1126 such as compact disks (CD), flash memory cards, digital video disk (DVD), and the like.

The electronic apparatus 1100 may also include a display device 1116, one or more speakers 1118, and a keyboard and/or controller 1130, which can include a mouse, trackball, touch pad, voice-recognition device, or any other device that permits a system user to input information into and receive information from the electronic apparatus 1100.

To better illustrate the integrated circuits and/or methods disclosed herein, a non-limiting list of examples is provided herein:

Example 1 includes an integrated circuit. The integrated circuit includes a substrate that includes a shape memory material, wherein the shape memory material is in a first deformed state and has a first crystallography structure and a first configuration, wherein the shape memory material is able to be physically deformed from a first configuration to a second configuration, wherein the shape memory material changes to a second crystallography structure and physically deforms back to the first configuration upon being supplied with energy, wherein the shape memory material returns to the first crystallography structure upon application of a different amount of energy; and an electronic component attached to substrate.

Example 2 includes the integrated circuit of example 1, wherein the shape memory material changes to a second crystallography structure and physically deforms back to the first configuration upon being supplied with at least one of electrical, thermal, magnetic, mechanical or ultra-violet energy.

Example 3 includes the integrated circuit of any one of examples 1 to 2, wherein the shape memory material is embedded in the substrate.

Example 4 includes the integrated circuit of any one of examples 1 to 3, wherein the shape memory material returns to the first crystallography structure upon removal of the energy.

Example 5 includes the integrated circuit of any one of examples 1 to 4, and further including a plurality electronic components attached to substrate, wherein at least two of the plurality electronic components are electrically connected when the substrate is in at least one of first configuration or the second configuration.

Example 6 includes the integrated circuit of any one of examples 1 to 5, wherein one of the plurality electronic components is at least one of an electronic package, a display, an antenna, a power source or a display.

Example 7 includes the integrated circuit of any one of examples 1 to 6, and further including at least one of a textile, chassis, and printed circuit board attached to the substrate.

Example 8 includes an integrated circuit. The integrated circuit includes a substrate that includes a shape memory material, wherein the shape memory material is in a first physically deformed state and has a first polymeric conformation and a first configuration, wherein the shape memory material is able to change from a first polymeric conformation to a second polymeric conformation and be physically deformed from a first configuration to a second configuration, wherein the shape memory material changes returns to the first polymeric conformation and physically deforms back to the first configuration upon being supplied with energy; and an electronic component attached to substrate.

Example 9 includes the integrated circuit of example 8, wherein the shape memory material changes to the first polymeric conformation and physically deforms back to the first configuration upon being supplied with at least one of electrical, thermal, magnetic or ultra-violet energy.

Example 10 includes the integrated circuit of any one of examples 8 to 9, wherein the shape memory material is embedded in the substrate.

Example 11 includes the integrated circuit of any one of examples 8 to 10, wherein the shape memory material maintains the first polymeric conformation upon removal of the energy.

Example 12 includes the integrated circuit of any one of examples 8 to 11, and further including a plurality electronic components attached to the substrate, wherein at least two of the plurality electronic components are electrically connected when the substrate is in at least one of the first configuration or the second configuration.

Example 13 includes the integrated circuit of example of any one of examples 8 to 12, wherein one of the plurality electronic components is at least one of an electronic package, a display, an antenna, a power source or a display.

Example 14 includes the integrated circuit of example of any one of examples 8 to 13, and further including at least one of a textile, chassis, and printed circuit board attached to the substrate.

Example 15 includes a method. The method includes attaching a shape memory material to a substrate; physically deforming the shape memory material from a first configuration to a second configuration; and applying energy to the shape memory material such that the shape memory material changes from the second configuration to the first configuration.

Example 16 includes the method of example 15, wherein applying energy to the shape memory material such that the shape memory material changes from the second configuration to the first configuration includes applying at least one of electrical, thermal, magnetic or ultra-violet energy to the shape memory material.

Example 17 includes the method of any one of examples 15 to 16, and further including physically deforming the shape memory material into the first configuration before attaching the shape memory material to the substrate.

Example 18 includes the method of any one of examples 15 to 17, and further including attaching a plurality electronic components to the substrate, wherein physically deforming the shape memory material from a first configuration to a second configuration includes electrically connecting the first electronic component to the second electronic component.

Example 19 includes the method of any one of examples 15 to 18, and further including attaching a plurality electronic components to the substrate, wherein applying energy to the shape memory material such that the shape memory material changes from the second configuration to the first configuration includes electrically connecting the first electronic component to the second electronic component.

Example 20 includes the method of any one of examples 15 to 19, and further including attaching the substrate to at least one of a textile, chassis, and printed circuit board.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including"

and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An integrated circuit, comprising:
   a substrate that includes a shape memory material, wherein the shape memory material is in a first deformed state and has a first crystallography structure and a first configuration, wherein the shape memory material is able to be physically deformed from a first configuration to a second configuration, wherein the shape memory material changes to a second crystallography structure and physically deforms back to the first configuration upon being supplied with energy, wherein the shape memory material returns to the first crystallography structure upon application of a different amount of energy; and
   a plurality electronic components attached to the substrate, wherein applying energy to the shape memory material such that the shape memory material changes from the second configuration to the first configuration includes electrically connecting a first electronic component to a second electronic component.

2. The integrated circuit of claim 1, wherein the shape memory material changes to a second crystallography structure and physically deforms back to the first configuration upon being supplied with at least one of electrical, thermal, magnetic, mechanical or ultra-violet energy.

3. The integrated circuit of claim 1, wherein the shape memory material is embedded in the substrate.

4. The integrated circuit of claim 1, wherein the shape memory material returns to the first crystallography structure upon removal of the energy.

5. The integrated circuit of claim 1, further comprising at least one of a textile, chassis, and printed circuit board attached to the substrate.

6. An integrated circuit, comprising:
   a substrate that includes a shape memory material, wherein the shape memory material is in a first physically deformed state and has a first polymeric conformation and a first configuration, wherein the shape memory material is able to change from a first polymeric conformation to a second polymeric conformation and be physically deformed from a first configuration to a second configuration, wherein the shape memory material changes returns to the first polymeric conformation and physically deforms back to the first configuration upon being supplied with energy, wherein the shape memory material is embedded in the substrate; and
   an electronic component attached to substrate.

7. The integrated circuit of claim 6, wherein the shape memory material changes to the first polymeric conformation and physically deforms back to the first configuration upon being supplied with at least one of electrical, thermal, magnetic or ultra-violet energy.

8. The integrated circuit of claim 6, wherein the shape memory material maintains the first polymeric conformation upon removal of the energy.

9. The integrated circuit of claim 6, further comprising a plurality electronic components attached to the substrate, wherein at least two of the plurality electronic components are electrically connected when the substrate is in at least one of the first configuration or the second configuration.

10. The integrated circuit of claim 9, wherein one of the plurality electronic components is at least one of an electronic package, a display, an antenna, a power source or a display.

11. The integrated circuit of claim 6, further comprising at least one of a textile, chassis, and printed circuit board attached to the substrate.

12. A method of using an integrated circuit, comprising:
    attaching a shape memory material to a substrate;
    physically deforming the shape memory material from a first configuration to a second configuration;
    applying energy to the shape memory material such that the shape memory material changes from the second configuration to the first configuration; and
    attaching a plurality electronic components to the substrate, wherein physically deforming the shape memory material from a first configuration to a second configuration includes electrically connecting a first electronic component to a second electronic component.

13. A method of using an integrated circuit, comprising:
    attaching a shape memory material to a substrate;
    physically deforming the shape memory material from a first configuration to a second configuration;
    applying energy to the shape memory material such that the shape memory material changes from the second configuration to the first configuration; and
    attaching a plurality electronic components to the substrate, wherein applying energy to the shape memory material such that the shape memory material changes from the second configuration to the first configuration includes electrically connecting a first electronic component to a second electronic component.

14. The method of claim 12, further comprising attaching the substrate to at least one of a textile, chassis, and printed circuit board.

15. The method of claim 12, wherein applying energy to the shape memory material such that the shape memory material changes from the second configuration to the first configuration includes applying at least one of electrical, thermal, magnetic or ultra-violet energy to the shape memory material.

16. The method of claim 12, wherein one of the plurality electronic components is at least one of an electronic package, a display, an antenna, a power source or a display.

17. The method of claim 13, wherein applying energy to the shape memory material such that the shape memory material changes from the second configuration to the first configuration includes applying at least one of electrical, thermal, magnetic or ultra-violet energy to the shape memory material.

18. The method of claim 13, wherein one of the plurality electronic components is at least one of an electronic package, a display, an antenna, a power source or a display.

19. The method of claim 13, further comprising attaching at least one of a textile, chassis, and printed circuit board attached to the substrate.

* * * * *